(12) United States Patent  
Koshimizu

(10) Patent No.: US 9,207,689 B2  
(45) Date of Patent: Dec. 8, 2015

(54) SUBSTRATE TEMPERATURE CONTROL METHOD AND PLASMA PROCESSING APPARATUS

(75) Inventor: Chishio Koshimizu, Nirasaki (JP)

(73) Assignee: TOKYO ELECTRON LIMITED (JP)

( * ) Notice: Subject to any disclaimer, the term of this patent is extended or adjusted under 35 U.S.C. 154(b) by 937 days.

(21) Appl. No.: 13/415,354

(22) Filed: Mar. 8, 2012

(65) Prior Publication Data

US 2012/0227955 A1  Sep. 13, 2012

Related U.S. Application Data

(60) Provisional application No. 61/466,174, filed on Mar. 22, 2011.

(30) Foreign Application Priority Data

Mar. 8, 2011 (JP) .................................. 2011-049781  
Mar. 6, 2012 (JP) .................................. 2012-048810

(51) Int. Cl.
| | |
|---|---|
| *G01L 21/30* | (2006.01) |
| *H01L 21/306* | (2006.01) |
| *G05D 23/19* | (2006.01) |
| *H01L 21/67* | (2006.01) |

(52) U.S. Cl.  
CPC ...... *G05D 23/1919* (2013.01); *H01L 21/67109* (2013.01); *H01L 21/67248* (2013.01); *H01L 21/67253* (2013.01)

(58) Field of Classification Search  
USPC .......................... 216/59; 438/715; 156/345.27  
See application file for complete search history.

(56) References Cited

U.S. PATENT DOCUMENTS 6,461,980 B1 * 10/2002 Cheung et al. ................. 438/765  
2004/0123805 A1 * 7/2004 Tomoyoshi .................... 118/728

FOREIGN PATENT DOCUMENTS

| JP | 2000-232098 | 8/2000 |
| JP | 2002-327275 | 11/2002 |
| JP | 2005039120 | 2/2005 |
| JP | 2006269556 | 10/2006 |

* cited by examiner

*Primary Examiner* — Shamim Ahmed  
(74) *Attorney, Agent, or Firm* — Cantor Colburn LLP

(57) ABSTRACT

Provided are a substrate temperature control method and a plasma processing apparatus using the method. The method includes: disposing a substrate on a placing table provided in a vacuum processing chamber; supplying a heat conduction gas between a rear surface of the substrate and the placing table; detecting a pressure of the heat conduction gas; comparing the detected pressure value with a set pressure value; controlling the supply of the heat conduction gas so that the detected pressure value becomes the set pressure value; and alternately repeating a first period where the set pressure value is set to be a first set pressure value that is higher than a low pressure value and equal to or higher than the lowest limit pressure value and a second period where the set pressure value is set to be a second set pressure value that is lower than the low pressure value.

8 Claims, 7 Drawing Sheets

SUBSTRATE TEMPERATURE CONTROL METHOD AND PLASMA PROCESSING APPARATUS

CROSS-REFERENCE TO RELATED APPLICATIONS

This application is based on and claims priorities from Japanese Patent Application Nos. 2011-049781 and 2012-048810, filed on Mar. 8, 2011 and Mar. 6, 2012, respectively, with the Japanese Patent Office, the disclosures of which are incorporated herein in their entireties by reference. Also, this application claims the benefit of U.S. Provisional Application No. 61/466,174 filed on Mar. 22, 2011, with the United States Patent and Trademark Office, the disclosure of which is incorporated herein in its entirety by reference.

TECHNICAL FIELD

The present disclosure relates to a substrate temperature control method and a plasma processing apparatus.

BACKGROUND

In the related art, in a manufacturing process of a semiconductor device, a plasma processing method has been used which performs an etching processing or a film forming processing by activating plasma on a substrate (for example, a semiconductor wafer) placed in a vacuum processing chamber.

In such a plasma processing apparatus, it is known that a temperature control mechanism is provided in a placing table on which a substrate is placed to heat or cool the placing table, and a heat conduction gas (so-called, backside gas), which is a heat carrier such as helium (He) gas, is supplied between a substrate disposing surface of the placing table and a rear surface of the substrate, thereby accelerating a heat exchange between the placing table and the substrate.

In this plasma processing apparatus, a technology is known which individually controls flow rates of gases having different heat conductivity, for example, helium (He) gas and argon (Ar) gas, as the backside gas and supplies the gases (see, for example, Japanese Patent Application Laid-Open No. 2002-327275).

A technology is known which intermittently adjusts the flow rate of the heat conduction gas to control the pressure of the heat conduction gas (see, for example, Japanese Patent Application Laid-Open No. 2000-232098).

BRIEF SUMMARY OF THE INVENTION

Among the above-described plasma processing apparatuses, in a plasma processing apparatus having a structure that applies a high frequency power to the placing table, electric discharge may occur through a supply line of heat conduction gas such as helium (He) gas. Therefore, the conductance or electric field strength is lowered by, for example, covering the supply line of the heat conduction gas with an insulator and increasing and narrowing the supply line of the heat conduction gas, or by, for example, inserting a baffle. As a result of lowering the conductance, it is difficult to supply the heat conduction gas such as helium (He) gas, and specifically, it is difficult to precisely control the pressure of the heat conduction gas in a low pressure region such as, for example, lower than 1330 Pa (10 Torr). As a result, it is not possible to precisely control the temperature of a substrate in the low pressure region of the heat conduction gas. Therefore, there is a problem in that the substantial temperature control range is limited.

The present disclosure has been made in an effort to provide a substrate temperature control method and a plasma processing apparatus in which a temperature of a substrate in a low pressure region of heat conduction gas can be precisely controlled and a process margin can be increased by expanding the temperature control range.

An exemplary embodiment of the present disclosure provides a substrate temperature control method including: disposing a substrate on a substrate disposing surface of a placing table provided in a vacuum processing chamber, the placing table being configured to be cooled or heated; supplying a heat conduction gas between a rear surface of the substrate and the substrate disposing surface of the placing table to control a temperature of the substrate; detecting a pressure of the heat conduction gas; comparing the detected pressure value with a set pressure value; controlling the supply of the heat conduction gas so that the detected pressure value becomes the set pressure value; and when the pressure of the heat conduction gas is set to a low pressure value that is lower than a predetermined lowest limit pressure value and the temperature of the substrate is controlled by suppressing the heat exchange between the substrate and the placing table, alternately repeating a first period where the set pressure value is set to be a first set pressure value that is higher than the low pressure value and equal to or higher than the lowest limit pressure value and a second period where the set pressure value is set to be a second set pressure value that is lower than the low pressure value.

Another exemplary embodiment of the present disclosure provides a plasma processing apparatus that activates plasma onto a substrate to perform a plasma processing, including: a vacuum processing chamber including a placing table configured to dispose the substrate on a substrate disposing surface, the placing table being configured to be cooled or heated; a gas supply unit configured to supply a heat conduction gas between a rear surface of the substrate and the substrate disposing surface of the placing table in order to control a temperature of the substrate; a pressure detecting mechanism configured to detect a pressure of the heat conduction gas; and a heat conduction gas supply control mechanism configured to compare the detected pressure value by the pressure detecting mechanism with a set pressure value to control the supply of the heat conduction gas so that the detected pressure value becomes the set pressure value. When the pressure of the heat conduction gas is set to a low pressure value that is lower than a predetermined lowest limit pressure value and the temperature of the substrate is controlled by suppressing the heat exchange between the substrate and the placing table, the heat conduction gas supply control mechanism alternately repeats a first period where the set pressure value is set to be a first set pressure value that is higher than the low pressure value and equal to or higher than the lowest limit pressure value and a second period where the set pressure value is set to be a second set pressure value that is lower than the low pressure value.

BRIEF DESCRIPTION OF THE DRAWINGS

Non-limiting and non-exhaustive embodiment will be described in conjunction with the accompanying drawings. Understanding that these drawings depict only several embodiments in accordance with the disclosure and are, therefore, not to be intended to limit its scope, the disclosure will be described with specificity and detail through use of the accompanying drawings, in which.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 1:
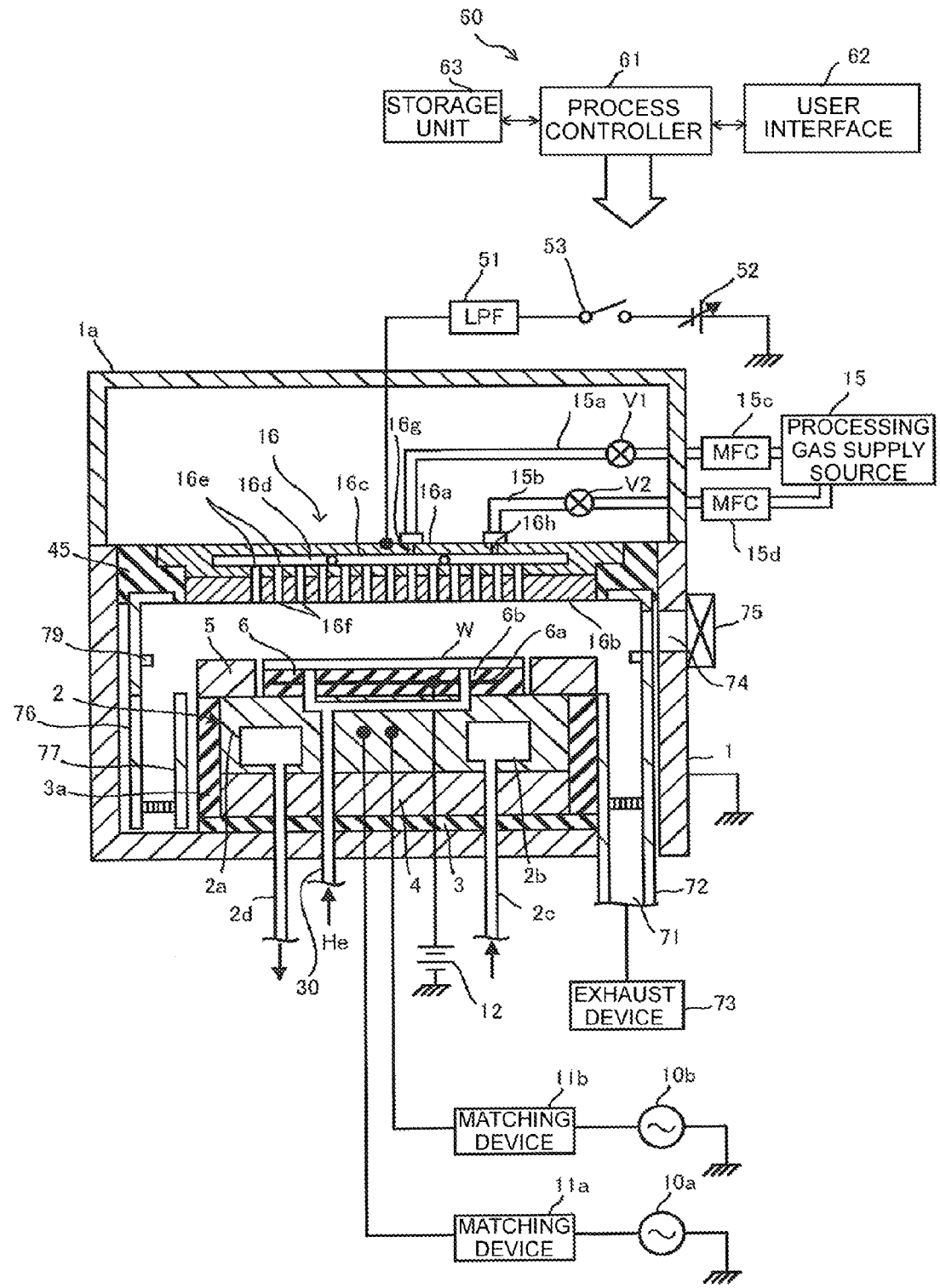
FIG. 1 is a view illustrating a schematic configuration of a plasma etching apparatus used in an exemplary embodiment of the present disclosure.

Hereinafter, an exemplary embodiment will be described with reference to the accompanying drawings. FIG. 1 shows a configuration of a plasma etching apparatus used in the present exemplary embodiment. First, the configuration of the plasma etching apparatus will be described.

The plasma etching apparatus includes a vacuum processing chamber 1 that is air tightly configured and electrically grounded. The vacuum processing chamber 1 is cylindrical and made of, for example, aluminum with an anodized surface. In the vacuum processing chamber 1, a placing table 2 is provided to horizontally support a semiconductor wafer W which is a substrate to be processed.

The placing table 2 has a base member 2a that is formed of a conductive metal such as, for example, aluminum and serves as a lower electrode. The placing table 2 is supported on a supporting table 4 of an insulator by an insulating plate 3. A focus ring 5 formed of, for example, monocrystalline silicon is provided on an upside outer circumference of the placing table 2. A cylindrical inner-wall member 3a formed of, such as, for example, quartz is provided so as to surround the peripheries of the placing table 2 and the supporting table 4.

A first high frequency power supply 10a and a second high frequency power supply 10b are connected to the base member 2a of the placing table 2 through a first matching device 11a and a second matching device 11b, respectively. The first high frequency power supply 10a is to generate plasma. A high frequency power of a predetermined frequency (27 MHz or higher, e.g., 40 MHz) is supplied from the first high frequency power supply 10a to the base member 2a of the placing table 2. The second high frequency power supply 10b is to inject ions (for biasing). A high frequency power of a predetermined frequency (13.56 MHz or lower, e.g., 3.2 MHz) that is lower than that of the first high frequency power supply 10a is supplied from the second high frequency power supply 10b to the base member 2a of the placing table 2. A shower head 16 that serves as an upper electrode is provided the above placing table 2 so as to face parallel to the placing table 2. The shower head 16 and the placing table 2 serve as a pair of electrodes (upper electrode and lower electrode).

An electrostatic chuck 6 is provided on an upper surface of the placing table 2 so as to electrostatically adsorb the semiconductor wafer W. The electrostatic chuck 6 is configured to have an electrode 6a embedded in an insulator 6b, and a DC power supply 12 is connected to the electrode 6a. A DC voltage is applied from the DC power supply 12 to the electrode 6a so that the semiconductor wafer W is adsorbed to the electrostatic chuck 6 by a Coulomb force.

A refrigerant flow passage 2b is formed inside the placing table 2, and a refrigerant inlet pipe 2c and a refrigerant outlet pipe 2d are connected to the refrigerant flow passage 2b. An appropriate refrigerant such as, for example, a coolant is circulated in the refrigerant flow passage 2b so that the placing table 2 is controllable to be at a predetermined temperature.

A backside gas supply pipe 30 that supplies heat conduction gas (backside gas) such as helium (He) gas to the rear surface of the semiconductor wafer W is provided so as to pass through the placing table 2. As enlarged in FIG. 2, the back side gas supply pipe 30 has a bent part 30a that is bent in the supporting table 4. The bent part 30a may lower the electric field strength and conductance, and, as a result, the electric discharge may be prevented from occurring in the backside gas supply pipe 30.

The backside gas supply pipe 30 is connected to a backside gas supply source 300. A pressure control valve 301 is formed on the way of the backside gas supply pipe 30, and an exhaust pipe 302, which is diverged at the downstream of the pressure control valve 301, is connected to the backside gas supply pipe 30. An exhaust control valve 303 is formed on the way of the exhaust pipe 302 and an exhaust device which is not shown is connected to an end of the exhaust pipe 302. A pressure gauge 304 that detects a pressure of the backside gas is disposed in the backside gas supply pipe 30.

A pressure control unit 310 compares a pressure value detected by the pressure gauge 304 and a set pressure value that is previously set in the pressure control unit 310, and adjusts opening degrees of the pressure control valve 301 and the exhaust control valve 303 so as to match the detected pressure and the set pressure, and controls the pressure of the backside gas to become a predetermined pressure (set pressure value). In other words, a heat conduction gas (backside gas) supply control mechanism is configured by such as the backside gas supply source 300, the pressure control valve 301, the exhaust pipe 302, the exhaust control valve 303, the pressure gauge 304, and the pressure control unit 310.

The semiconductor wafer W adsorbed and supported by the electrostatic chuck 6 on the upper surface of the placing table 2 may be controlled to be at a predetermined temperature by, for example, a refrigerant circulating mechanism including the refrigerant flow passage 2b, the refrigerant inlet pipe 2c, the refrigerant outlet pipe 2d and the heat conduction gas (backside gas) supply control mechanism described above.

The shower head 16 described above is provided on a portion of a ceiling wall of the vacuum processing chamber 1. The shower head 16 includes a main body 16a and a top panel 16b that constitutes an electrode plate, and is supported on the upper portion of the vacuum processing chamber 1 by an insulating member 45. The main body 16a is formed of a conductive material, for example, aluminum with an anodized surface, and is configured to detachably hold the top panel 16b at the lower portion thereof.

The gas diffusion chambers 16c and 16d are provided inside the main body 16a and a plurality of gas ventilating holes 16e are provided in the bottom of the main body 16a so as to be disposed at the lower portion of the gas diffusion chambers 16c and 16d. The gas diffusion chambers 16c and 16d are divided into the gas diffusion chamber 16c provided at the center and the gas diffusion chamber 16d provided at the peripheral portion so as to independently change the processing gas supplying status at the center and the peripheral portion.

On the top panel 16b, a gas introducing hole 16f is provided so as to pass through the top panel 16b in the thickness direction and overlaps each of the gas ventilating holes 16e. With the above-mentioned configuration, the processing gas supplied to the gas diffusion chambers 16c and 16d is dispersed and supplied in the vacuum processing chamber 1 similarly to shower spray through the gas ventilating holes 16e and the gas introducing holes 16f In the main body 16a, a pipe for circulating the refrigerant which is not shown may be provided and the shower head 16 may be cooled down to a desired temperature during the plasma etching processing.

In the main body 16a described above, two the gas inlet ports 16g and 16h are formed for introducing the processing gas to the gas diffusion chambers 16c and 16d. The gas supply pipes 15a and 15b are connected to the gas inlet ports 16g and 16h, and a processing gas supply source 15 that supplies an etching processing gas is connected to the other ends of the gas supply pipes 15a and 15b. In the gas supply pipe 15a, a mass flow controller (MFC) 15c and an ON/OFF valve V1 are provided in this order from the upstream side. In the gas supply pipe 15b, a mass flow controller (MFC) 15d and an ON/OFF valve V2 are provided in this order from the upstream side.

The processing gas for plasma etching is supplied from the processing gas supply source 15 to the gas diffusion chambers 16c and 16d through the gas supply pipes 15a and 15b, and diffused and supplied from the gas diffusion chambers 16c and 16d to the vacuum processing chamber 1 through the gas ventilating holes 16e and the gas introducing holes 16f similarly to shower spray.

A variable DC power supply 52 is electrically connected to the shower head 16 that serves as the upper electrode through a low pass filter (LPF) 51. The supply of the power of the variable DC power supply 52 may be turned ON or OFF by an ON/OFF switch 53. The current or voltage of the variable DC power supply 52 and ON or OFF of ON/OFF switch 53 may be controlled by a control unit 60 which will be described below. As will be described below, when the high frequency waves are applied from the first high frequency power supply 10a and the second high frequency power supply 10b to the placing table 2 to generate plasma in the processing space, if needed, the ON/OFF switch 53 is turned ON by the control unit 60 so that a predetermined DC voltage is applied to the shower head 16 serving as the upper electrode.

A cylindrical grounded conductor 1a is provided so as to be extended from the side wall of the vacuum processing chamber 1 to be higher than the height position of the shower head 16. The cylindrical grounded conductor 1a includes a ceiling wall on the top portion thereof.

An exhaust port 71 is formed at the bottom of the vacuum processing chamber 1, and an exhaust device 73 is connected to the exhaust port 71 through an exhaust pipe 72. The exhaust device 73 includes a vacuum pump and operates the vacuum pump to reduce the pressure in the vacuum processing chamber 1 to a predetermined degree of vacuum. In the meantime, a carrying in/out port 74 for the semiconductor wafer W is provided on the side wall of the vacuum processing chamber 1, and a gate valve 75 that opens and closes the carrying in/out port 74 is provided in the carrying in/out port 74.

Reference numerals 76 and 77 in the drawings denote removable deposition shields. The deposition shield 76 is provided along the inner wall surface of the vacuum processing chamber 1 and prevents the etching by-product (deposition) from being attached onto the vacuum processing chamber 1. At a position of the deposition shield 76 that is substantially the same height as the semiconductor wafer W, a conductive member (GND block) 79 that is galvanically connected to the ground is provided, which prevents the abnormal electric discharge.

Figure 2:
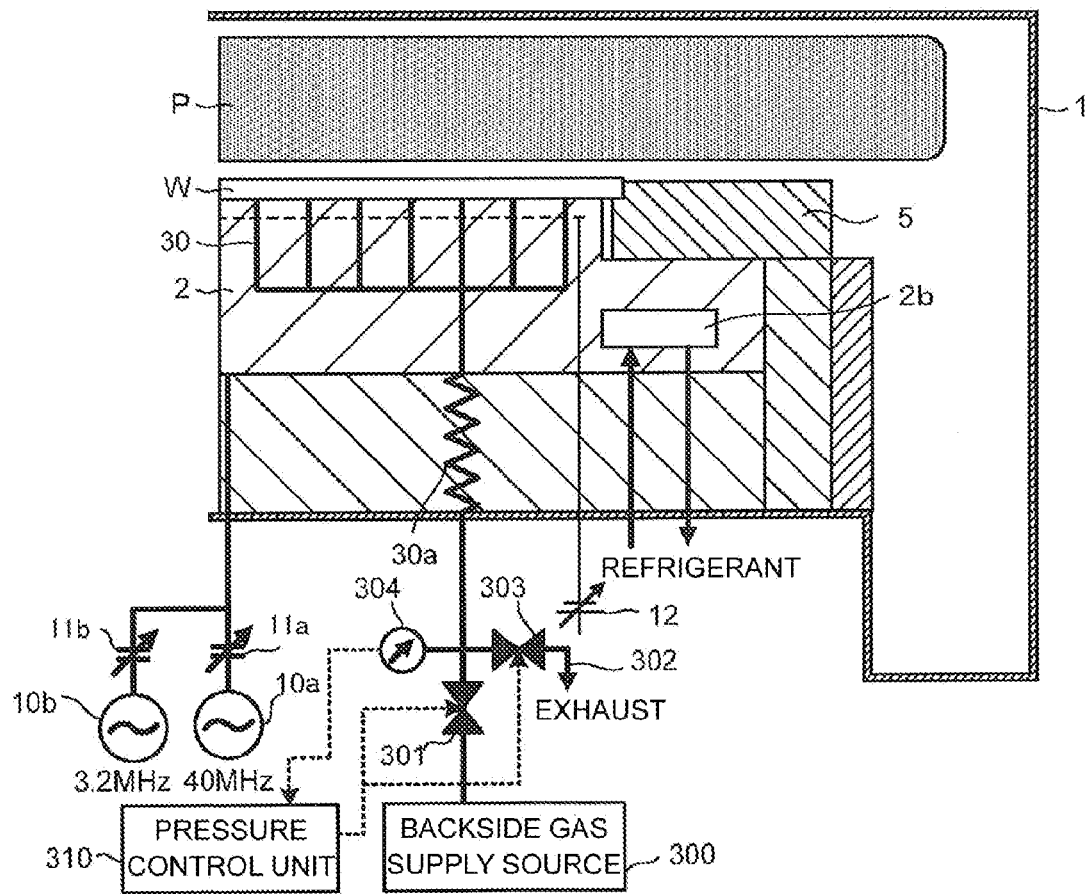
FIG. 2 is a view typically illustrating a schematic configuration of a main part of the plasma etching apparatus of FIG. 1.

The operation of the plasma etching apparatus with the above configuration is generally controlled by the control unit 60. The control unit 60 includes a process controller 61 that includes a CPU to control individual units of the plasma etching apparatus, a user interface 62, and a storage unit 63. The pressure control unit 310 shown in FIG. 2 is also controlled by the control unit 60.

The user interface 62 is configured by, for example, a keyboard that allows a process manager to input commands to manage the plasma etching apparatus, and a display that visualizes and displays the operational status of the plasma etching apparatus.

In the storage unit 63, a recipe is stored in which a control program (software) that performs various processings to be performed by the plasma etching apparatus under the control of the process controller 61 or processing condition data is stored. If necessary, an arbitrary recipe is called from the storage unit 63 by an instruction from the user interface 62 and performed by the process controller 61 to perform a desired processing by the plasma etching apparatus under the control of the process controller 61. The recipe such as the control program or processing condition data that is stored in a computer readable recording medium (for example, a hard disc, a CD, a flexible disk, or a semiconductor memory) may be used or a recipe that is frequently transmitted from the other device through, for example, a dedicated line may be used online.

Next, a temperature control method of a semiconductor wafer W in the plasma etching apparatus with the above configuration will be described. As described above, the temperature of the placing table 2 is adjusted to a predetermined temperature by the refrigerant that circulates in the refrigerant flow passage 2b. Plasma P is activated on the semiconductor wafer W that is disposed and fixed onto the placing table 2 to increase the temperature of the semiconductor wafer W, so that the placing table 2 should be cooled down in most cases. The backside gas, such as helium (He) gas, is supplied between the wafer disposing surface of the placing table 2 and the rear surface of the semiconductor wafer W through the backside gas supply pipe 30 so that the backside gas having a predetermined pressure is present therebetween to accelerate the heat exchange between the semiconductor wafer W and the placing table 2. As a result, the temperature of the semiconductor wafer is maintained at a predetermined temperature during the plasma processing.

Therefore, if the pressure of the backside gas is higher, the temperature of the semiconductor wafer W is closer to the temperature of the placing table 2. In contrast, if the pressure of the backside gas becomes lower, the amount of heat exchange between the semiconductor wafer W and the placing table 2 is reduced so that the temperatures of the semiconductor wafer W and the temperature of the placing table 2 become different from each other. For example, when the placing table 2 is cooled down to a predetermined temperature, as the pressure of the backside gas becomes higher, the temperature of the semiconductor wafer W becomes lower. In contrast, as the pressure of the backside gas becomes lower, the temperature of the semiconductor wafer W becomes higher.

Figure 3:
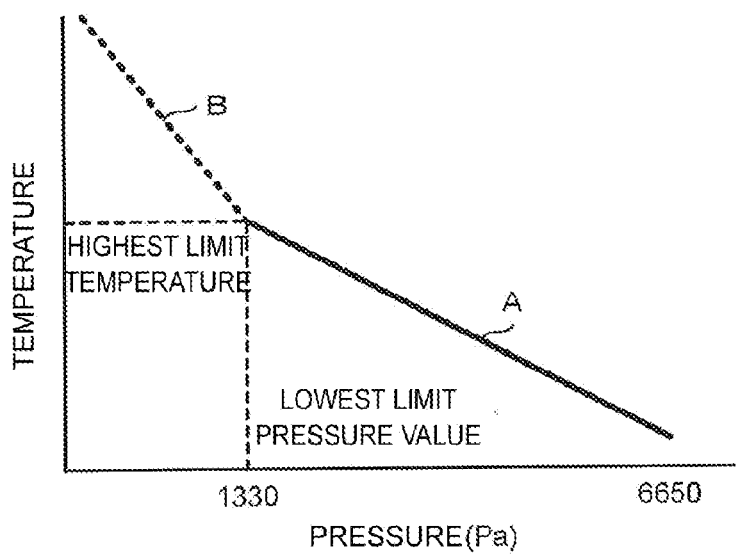
FIG. 3 is a graph illustrating a substrate temperature control method according to an exemplary embodiment.

A straight line A shown in a graph of FIG. 3 that describes a temperature as a vertical axis and a pressure of the backside gas as a horizontal axis represents the relationship between the temperature of the semiconductor wafer W and the pressure of the backside gas. As represented by straight line A shown in the graph of FIG. 3, the pressure control unit 310 adjusts the pressure of the backside gas based on the pressure of the backside gas determined based on the required temperature of the semiconductor wafer W to control the temperature of the semiconductor wafer W. The control is performed when the pressure is equal to or higher than a predetermined lowest limit pressure value (1330 Pa (10 Torr) in the graph of FIG. 3), in other words, when the set temperature is the highest limit temperature or less, which is represented in the graph of FIG. 3.

In the meantime, when the pressure of the backside gas needs to be lower than the predetermined lowest limit pressure value (1330 Pa (10 Torr) in the graph of FIG. 3), in other words, when the set temperature is higher than the highest limit temperature in the graph of FIG. 3, the temperature of the semiconductor wafer W is controlled by the control of the pressure of the backside gas, as described below.

If it is required that the pressure of the backside gas is set to a low pressure value, that is lower than the lowest limit pressure value, for example, 665 Pa (5 Torr), and the heat exchange between the semiconductor wafer W and the placing table 2 is suppressed so that the temperature of the semiconductor wafer W is controlled to be a certain high temperature, a first period where the set pressure value in the gas pressure control unit 310 is set to be a first set pressure value that is higher than the low pressure value (665 Pa (5 Torr)) and equal to or higher than the lowest limit pressure value (1330 Pa (10 Torr)) and a second period where the set pressure value is set to be a second set pressure value that is lower than the low pressure value (665 Pa (5 Torr)) are alternately repeated.

Figure 4:
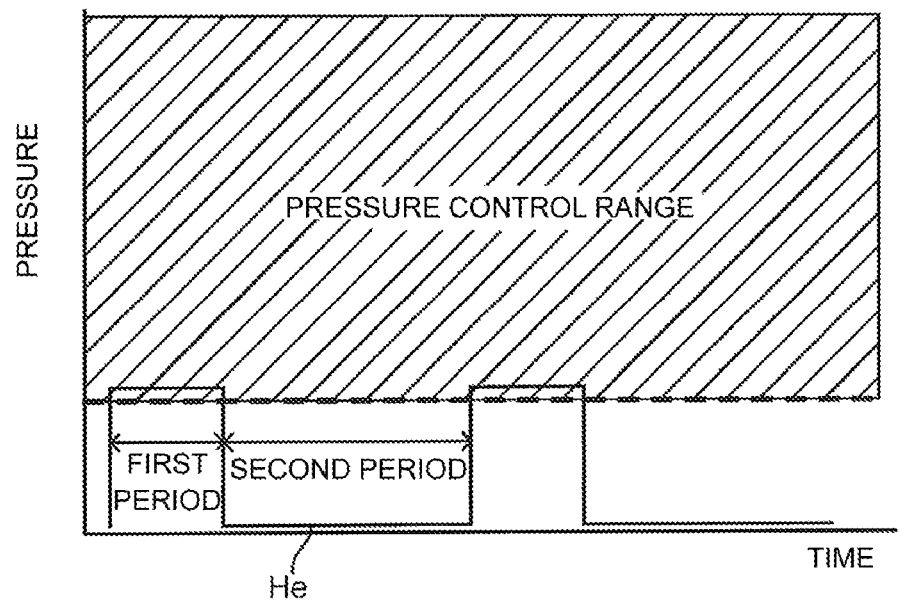
FIG. 4 is a graph illustrating a substrate temperature control method according to an exemplary embodiment.

A graph of FIG. 4 that describes a pressure as a vertical axis and a time as a horizontal axis represents an example where the first set pressure value is 1330 Pa (10 Torr) and the second set pressure value is 0 Pa. The first period where the set pressure value is set to be a first set pressure value and the second period where the set pressure value is set to be a second set pressure value are short, for example, 0.01 second to 10 second and more preferably 0.1 second to 10 second. The control is performed by alternately repeating the above first and second periods in plural times.

The above control is for the following reason. That is, as described above, the conductance of the backside gas supply pipe 30 is set to be low in order to prevent the electric discharge caused by the high frequency power applied to the placing table 2. If the pressure of the backside gas is controlled by the low set pressure value, it is difficult to stably control the pressure. Generally, the pressure of the backside gas that can stably control the pressure is approximately 1330 Pa (10 Torr). Therefore, if the pressure is lower than the above pressure, it is not possible to stably control the pressure. Accordingly, the first period where the set pressure value is the pressure that can stably control the pressure and the second period where the set pressure value is lower than the pressure to be targeted are alternately repeated. As a result, the pressure of the backside gas is controlled so that the average temperature of the semiconductor wafer W becomes a desired temperature while some temperature variation is allowed.

Therefore, the temperature of the semiconductor wafer W may be set to a temperature in a high temperature range that cannot be set in the related art because it is difficult to precisely control the temperature in the related art. It is also possible to precisely control the temperature of the semiconductor wafer W in the low pressure region of the heat conduction gas. The temperature control range is extended to increase the process margin.

Even though it is further considered that the temperature of the semiconductor wafer W is controlled by changing the temperature of the refrigerant that flows in the refrigerant flow passage 2b of the placing table 2, it takes time to change the temperature of the placing table 2 by changing the temperature of the refrigerant, and thus, it is difficult to perform the above control of the temperature of the semiconductor wafer W in a short time. Therefore, when plural kinds of plasma processings are continuously performed in the vacuum processing chamber 1, the above control cannot be applied to the case where the set temperature of the semiconductor wafer W is changed according to the processing.

Figure 5:
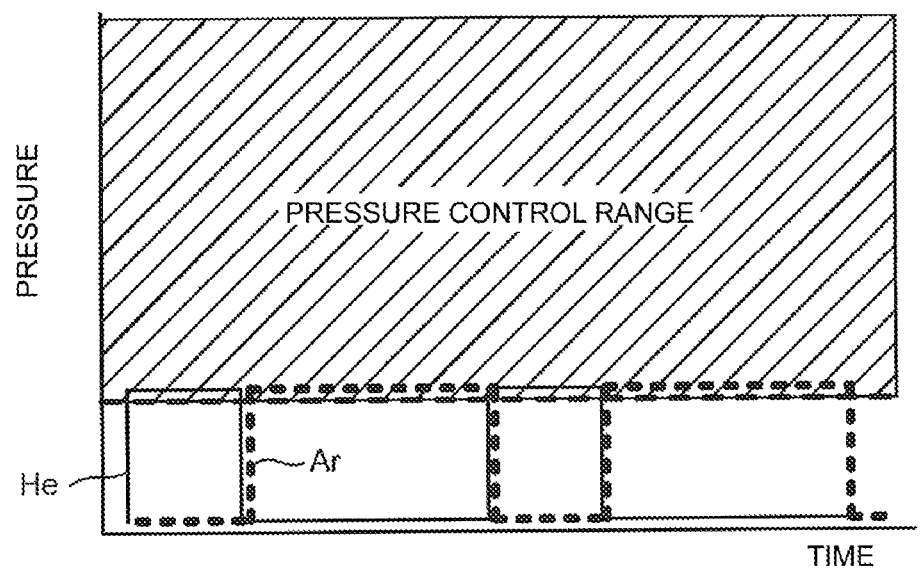
FIG. 5 is a graph illustrating a substrate temperature control method according to a modified example.

A graph of FIG. 5 that describes a pressure as a vertical axis and a time as a horizontal axis represents a modified example where two kinds of gases, for example, helium (He) gas and argon (Ar) gas are used as the heat conduction gases. As shown in the graph of FIG. 5, during the second period (the second set pressure value is 0 Pa) of the helium gas as the heat conduction gas as shown in FIG. 4, another kind of heat conduction gas having different work functions of the heat conduction, for example, argon gas may be supplied. As the heat conduction gas, in addition to the helium gas and the argon gas, nitrogen ($N_2$) gas or oxygen ($O_2$) gas may be used.

A third period where a set pressure is a third set pressure value that is lower than the first set pressure value and higher than the second set pressure value is set, and the first period, the second period, and the third period may be sequentially repeated in this order, or the first period, the third period, and the second period may be sequentially repeated in this order. In this case, as the heat conduction gas, three kinds of gases having different work functions of the heat conduction may be used to allow the different heat conduction gases to flow for every period of the first to third periods.

FIGS. 6 to 12 show configurations of other exemplary embodiments of the pressure gauge 304. As described above, since a high frequency power is applied to the placing table 2, it is difficult to detect the pressure of the backside gas near the placing table 2. However, if the pressure of the backside gas is detected at a position nearer the substrate disposing surface of the placing table 2, the pressure of the backside gas is more precisely detected, and thus the pressure of the backside gas may be more precisely controlled.

Figure 6:
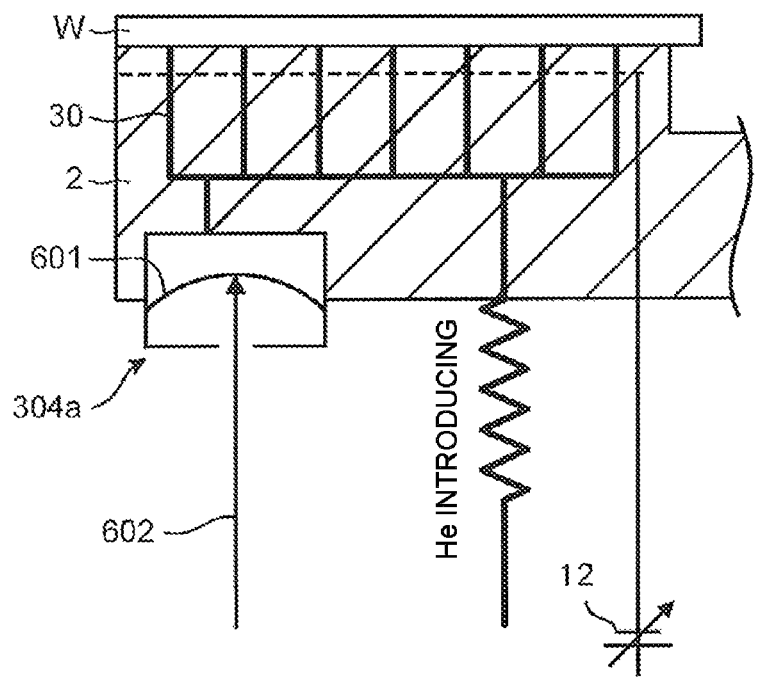
FIG. 6 is a view illustrating a schematic configuration of a main part of a plasma etching apparatus according to a modified example.

A pressure gauge 304a shown in FIG. 6 is configured such that a diaphragm 601 that is physically deformed by the pressure of the backside gas is provided at a part of the backside gas supply pipe 30 of the placing table 2, and a laser displacement gauge that reads out the displacement of the diaphragm 601 using a laser beam 602 is provided.

Figure 7:
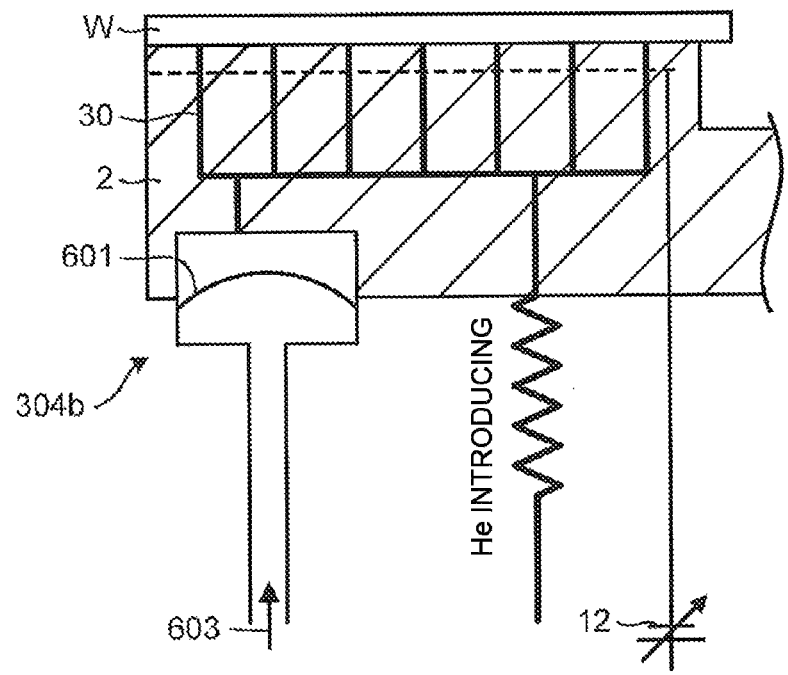
FIG. 7 is a view illustrating a schematic configuration of a main part of a plasma etching apparatus according to a modified example.

A pressure gauge 304b shown in FIG. 7 is configured such that the diaphragm 601 that is physically deformed by the pressure of the backside gas is provided at a part of the backside gas supply pipe 30 of the placing table 2, and an acoustic wave or an electromagnetic wave 603 is radiated onto the diaphragm 601 to read out the displacement of the diaphragm 601 by a resonant frequency.

Figure 8:
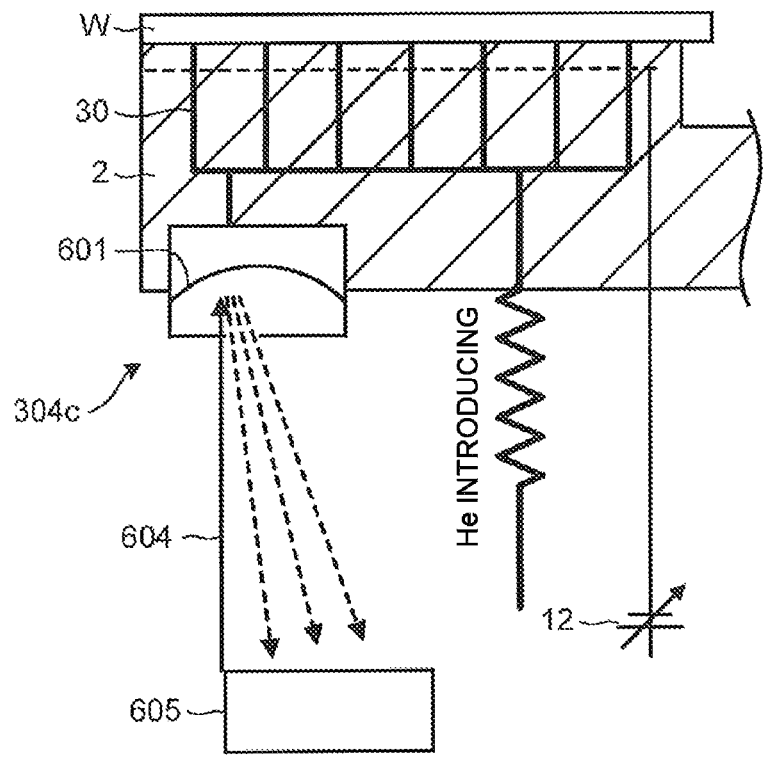
FIG. 8 is a view illustrating a schematic configuration of a main part of a plasma etching apparatus according to a modified example.

A pressure gauge 304c shown in FIG. 8 is configured such that the diaphragm 601 that is physically deformed by the pressure of the backside gas is provided at a part of the backside gas supply pipe 30 of the placing table 2, and the light 604 is irradiated onto the diaphragm 601 and the position where the light 604 is returned by being reflected from the diaphragm 601 is detected by a CCD 605 to read out the displacement of the diaphragm 601.

Figure 9:
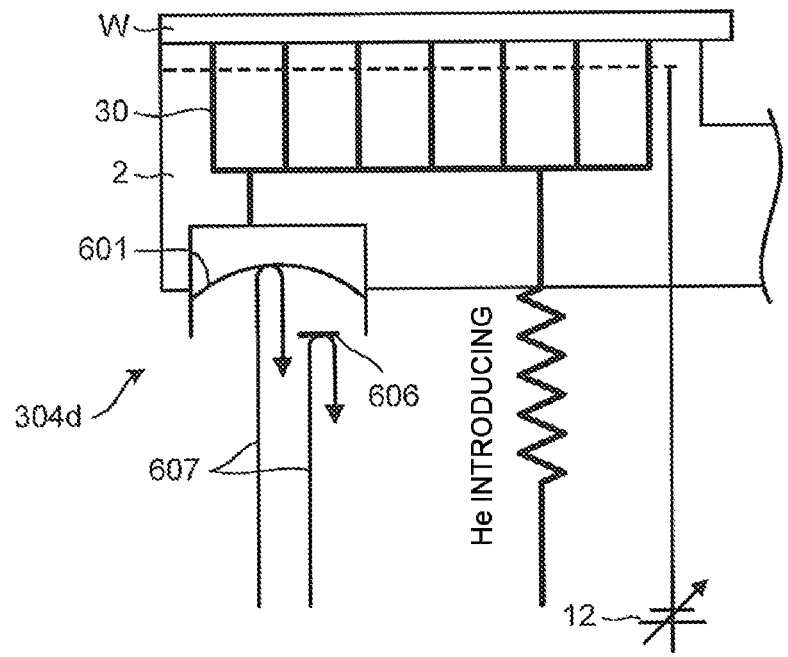
FIG. 9 is a view illustrating a schematic configuration of a main part of a plasma etching apparatus according to a modified example.

A pressure gauge 304d shown in FIG. 9 is configured such that the diaphragm 601 that is physically deformed by the pressure of the backside gas is provided at a part of the backside gas supply pipe 30 of the placing table 2, and a reference surface 606 is provided to measure the distance difference between the diaphragm 601 and the reference surface 606 by a laser interferometer or an electromagnetic interferometer that uses the laser or an electromagnetic wave 607 to read out the displacement of the diaphragm 601.

Figure 10:
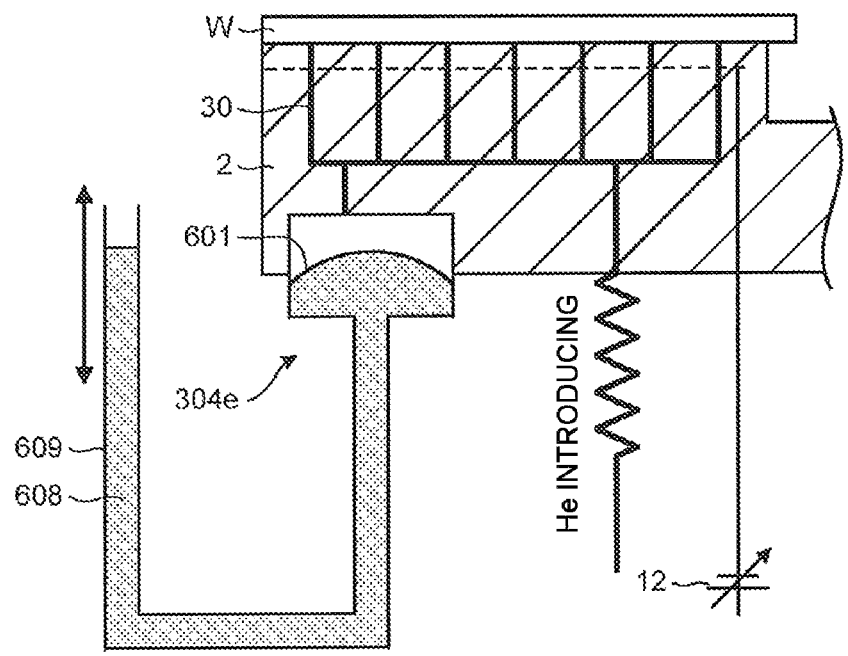
FIG. 10 is a view illustrating a schematic configuration of a main part of a plasma etching apparatus according to a modified example.

A pressure gauge 304e shown in FIG. 10 is configured such that the diaphragm 601 that is physically deformed by the pressure of the backside gas is provided at a part of the backside gas supply pipe 30 of the placing table 2 and the displacement of the diaphragm 601 is read out from the up/down height of the liquid surface of the liquid 608 in a pipe 609 that is connected to the diaphragm 601.

Figure 11:
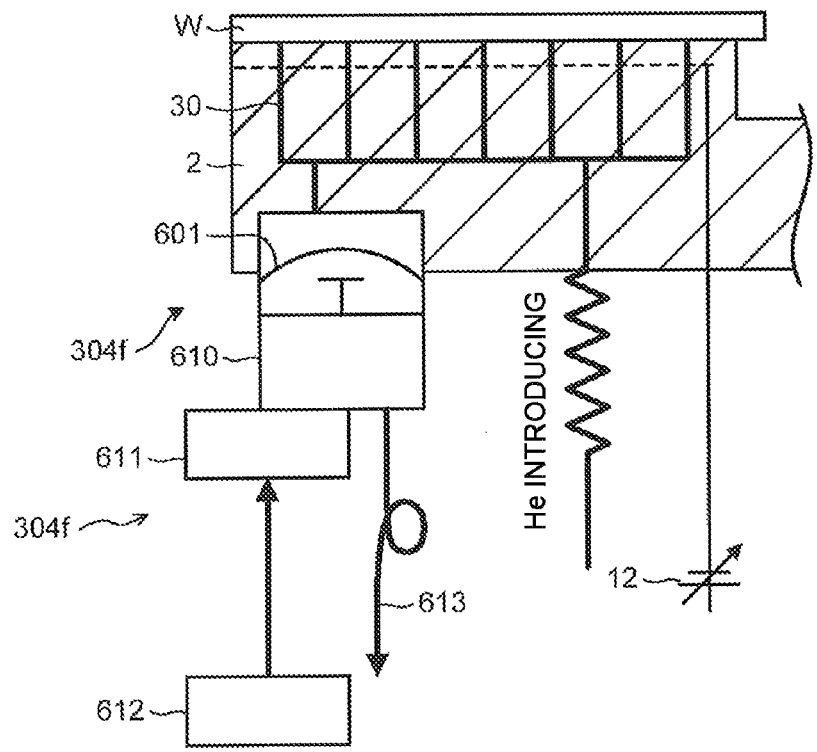
FIG. 11 is a view illustrating a schematic configuration of a main part of a plasma etching apparatus according to a modified example.

A pressure gauge 304f shown in FIG. 11 is configured such that the diaphragm 601 that is physically deformed by the pressure of the backside gas is provided at a part of the backside gas supply pipe 30 of the placing table 2 and the displacement of the diaphragm 601 is measured by a measuring circuit 610. The measuring circuit 610 includes a solar cell 611 and light is irradiated from an external light source 612 to the solar cell 611 to obtain power. A measurement signal is transmitted to the outside by an optical fiber 613. Therefore, the pressure gauge 304f has a configuration that is hardly affected by the high frequency power applied to the placing table 2.

Figure 12:
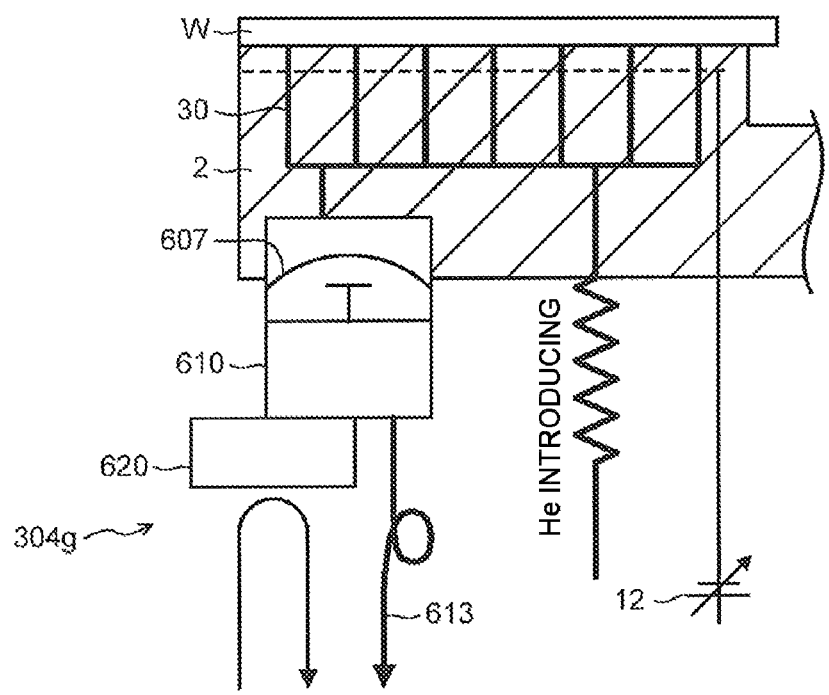
FIG. 12 is a view illustrating a schematic configuration of a main part of a plasma etching apparatus according to a modified example.

A pressure gauge 304g shown in FIG. 12 is configured such that the solar cell 611 of the pressure gauge 304f shown in FIG. 11 is replaced with a Peltier element 620 and the Peltier element 620 is heated to obtain power. Since the other parts are the same as the pressure gauge 304f, the duplicated descriptions thereof will be omitted.

As in the pressure gauges 304a to 304g described above, the diaphragm 601 that is physically deformed by the pressure of the backside gas is provided at a part of the backside gas supply pipe 30 of the placing table 2 and the displacement of the diaphragm 601 is read out, so that the pressure of the backside gas may be more precisely detected, and the pressure of the backside gas may be more precisely controlled.

Next, procedures of etching a thin film formed on the semiconductor wafer W using plasma by the plasma etching apparatus with the above configuration will be described. First, the gate valve 75 is opened so that the semiconductor wafer W is carried from the carrying in/out port 74 into the vacuum processing chamber 1 through a load lock chamber (not shown) by a conveying robot (not shown) to be disposed on the placing table 2. Thereafter, the conveying robot is relocated to the outside of the vacuum processing chamber 1 to close the gate valve 75. The inside of the vacuum processing chamber 1 is exhausted through the exhaust port 71 by the vacuum pump of the exhaust device 73.

After the inside of the vacuum processing chamber 1 becomes a predetermined degree of vacuum, a predetermined processing gas (etching gas) is introduced from the processing gas supply source 15 into the vacuum processing chamber 1, and thus the inside of the vacuum processing chamber 1 is maintained at a predetermined pressure. In this case, the supply status of the processing gas from the processing gas supply source 15 may be varied at the center and the peripheral portion. Among the total supply amount of processing gas, the rate of a supply amount from the center and a supply amount from the peripheral portion may be controlled to be a desired value.

In this status, a high frequency power having, for example, a frequency of 40 MHz is supplied from the first high frequency power supply 10a to the placing table 2. From the second high frequency power supply 10b, a high frequency power (for biasing) having, for example, a frequency of 3.2 MHz is supplied to the base member 2a of the placing table 2 to inject ions. In this case, a predetermined DC voltage is applied from the DC power supply 12 to the electrode 6a of the electrostatic chuck 6 and the semiconductor wafer W is adsorbed onto the electrostatic chuck 6 by the Coulomb force.

As described above, the high frequency power is applied to the placing table 2 that serves as the lower electrode so that an electric field is formed between the shower head 16 serving as the upper electrode and the placing table 2 serving as the lower electrode. By the electric field, the electric discharge is occurred in the processing space where the semiconductor wafer W is present, and thus the thin film formed on the semiconductor wafer W is etched by the plasma of the processing gas formed accordingly. While the etching processing is performed, in the present exemplary embodiment, the temperature of the semiconductor wafer W can be set to the temperature in the high temperature range which cannot be set in the related art because it is difficult to precisely control the temperature in the related art. The temperature of the semiconductor wafer W may be precisely controlled in the low pressure region of the heat conduction gas. The temperature control range may be expanded to increase the process margin.

As described above, since the DC voltage may be applied to the shower head 16 during the plasma processing, the following effects can be obtained. For example, in some processes, plasma having low ion energy is required even with the high electronic density. In this case, if the DC voltage is used, the ion energy injected in the semiconductor wafer W is suppressed so that the electronic density of the plasma is increased. Therefore, the etching rate of the thin film of the semiconductor wafer W that is an object to be etched is increased and the sputter rate to the thin film that is a mask provided on the upper part of the object to be etched is lowered so that the selectivity is improved.

When the etching processing is completed, the supply of the high frequency power, the supply of the DC voltage, and the supply of the processing gas are stopped. And then, the semiconductor wafer W is carried out from the vacuum processing chamber 1 in the reverse order of the above-described order.

As described above, the exemplary embodiments may provide a substrate temperature control method and a plasma processing apparatus that are capable of precisely controlling the temperature of the substrate in the low pressure region of the heat conduction gas, and increasing the process margin by expanding the temperature control range. This present disclosure is not limited to the above-described exemplary embodiments, but various modifications can be made.

According to the exemplary embodiments of the present disclosure, it is possible to precisely control a temperature of a substrate in a low pressure region of heat conduction gas and increase a process margin by expanding the temperature control range.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate temperature control method comprising:
    disposing a substrate on a substrate disposing surface of a placing table provided in a vacuum processing chamber, the placing table being configured to be cooled or heated;
    supplying a heat conduction gas between a rear surface of the substrate and the substrate disposing surface of the placing table to control a temperature of the substrate;
    detecting a pressure of the heat conduction gas;
    comparing the detected pressure value with a set pressure value;
    controlling the supply of the heat conduction gas so that the detected pressure value becomes the set pressure value; and
    when the pressure of the heat conduction gas is set to a low pressure value that is lower than a predetermined lowest limit pressure value and the temperature of the substrate is controlled by suppressing the heat exchange between the substrate and the placing table, alternately repeating a first period where the set pressure value is set to be a first set pressure value that is higher than the low pressure value and equal to or higher than the predetermined lowest limit pressure value and a second period where the set pressure value is set to be a second set pressure value that is lower than the low pressure value,
    wherein the predetermined lowest limit pressure value is a minimum value for the heat exchange between the substrate and the placing table using the heat conduction gas.

2. The substrate temperature control method of claim 1, wherein the first set pressure value is in a range of 1330 Pa to 13300 Pa, and the second set pressure value is in a range of 0 Pa to 665 Pa.

3. The substrate temperature control method of claim 1, wherein the first period and the second period are in a range of 0.01 sec to 10 sec.

4. The substrate temperature control method of claim 1, wherein the heat conduction gas is any one selected from the group consisting of helium gas, argon gas, nitrogen gas, and oxygen gas.

5. The substrate temperature control method of claim 1, wherein the heat conduction gas is any two kinds of gases selected from the group consisting of helium gas, argon gas, nitrogen gas, and oxygen gas, and the two kinds of gases are alternately supplied during the first period and the second period.

6. The substrate temperature control method of claim 1, wherein the pressure of the heat conduction gas is detected by a diaphragm provided in the placing table and configured to be deformed depending on the pressure of the heat conduction gas, and by a pressure gauge including a detecting mechanism configured to detect the amount of deformity of the diaphragm.

7. The substrate temperature control method of claim 1, further comprising, when the pressure of the heat conduction gas is set to the low pressure value that is lower than the predetermined lowest limit pressure value and the temperature of the substrate is controlled by suppressing the heat exchange between the substrate and the placing table, sequentially repeating the first period, the second period, and a third period where the set pressure value is set to a third set pressure value that is lower than the first set pressure value and higher than the second set pressure value.

8. The substrate temperature control method of claim 7, wherein the heat conduction gas is any three kinds of gases selected from the group consisting of helium gas, argon gas, nitrogen gas, and oxygen gas, and the three kinds of gases are sequentially supplied during the first period, the second period, and the third period.

* * * * *